（12） United States Patent
Ma et al.

(10) Patent No.: US 8,717,835 B2
(45) Date of Patent: May 6, 2014

(54) APPARATUSES AND METHODS FOR COMPENSATING FOR POWER SUPPLY SENSITIVITIES OF A CIRCUIT IN A CLOCK PATH

(75) Inventors: Yantao Ma, Boise, ID (US); Tyler Gomm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 259 days.

(21) Appl. No.: 13/215,705

(22) Filed: Aug. 23, 2011

(65) Prior Publication Data

US 2013/0051166 A1 Feb. 28, 2013

(51) Int. Cl.
*G11C 7/00* (2006.01)

(52) U.S. Cl.
USPC ........... 365/194; 365/191; 327/141; 327/158; 327/161

(58) Field of Classification Search
USPC ................... 365/194, 191; 327/141, 158, 161
See application file for complete search history.

(56) References Cited

U.S. PATENT DOCUMENTS

| 7,111,185 | B2 | 9/2006 | Gomm et al. | |
| 7,411,852 | B2 | 8/2008 | Nishioka et al. | |
| 7,443,216 | B2 | 10/2008 | Gomm et al. | |
| 7,715,260 | B1 | 5/2010 | Kuo et al. | |
| 7,945,800 | B2 | 5/2011 | Gomm et al. | |
| 2005/0182983 | A1* | 8/2005 | Gaskins et al. | 713/322 |
| 2010/0090730 | A1* | 4/2010 | Wu | 327/143 |
| 2011/0204963 | A1* | 8/2011 | Kim | 327/536 |

FOREIGN PATENT DOCUMENTS

CN 101752009 A 6/2010

\* cited by examiner

*Primary Examiner* — Son Dinh
*Assistant Examiner* — Hien Nguyen
(74) *Attorney, Agent, or Firm* — Dorsey & Whitney LLP

(57) ABSTRACT

Apparatuses and methods for compensating for differing power supply sensitivities of a circuit in a clock path. One such method includes altering signal timing of at least one of reference and feedback clock signals differently according to variations in power supply voltage to compensate for differences in delay power supply sensitivities of delays of a forward clock path and of a feedback clock path. Another example method includes providing an output clock signal in phase with an input clock signal and compensating for delay error between delays used in providing at least some of the delay of the output clock signal relative to the input clock signal by providing delays having power supply sensitivities resulting in a combined power supply sensitivity that is inverse to the delay error.

23 Claims, 10 Drawing Sheets

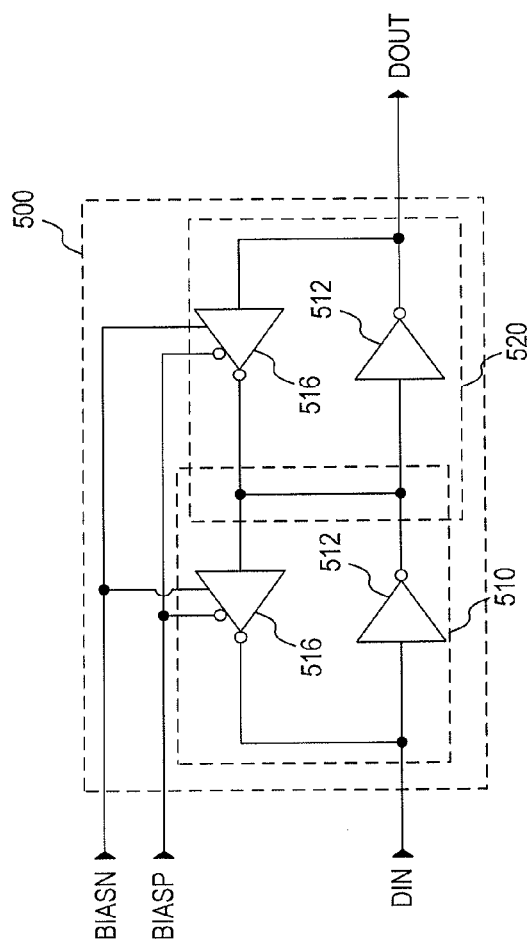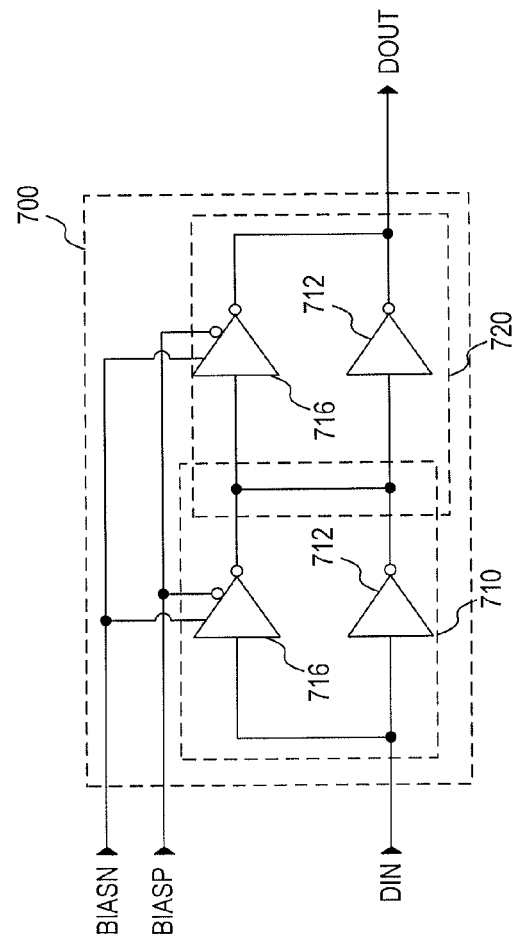

APPARATUSES AND METHODS FOR COMPENSATING FOR POWER SUPPLY SENSITIVITIES OF A CIRCUIT IN A CLOCK PATH

TECHNICAL FIELD

Embodiments of the present invention relate generally to compensating for power supply sensitivities, and more specifically, in one or more illustrated embodiments, to apparatuses and methods for compensating for timing variations in delay circuits in a clock path resulting from delay power supply sensitivities.

BACKGROUND OF THE INVENTION

Memories typically include a plurality of memory cells, which may be arranged in an array of intersecting rows and columns. Read and write operations, to respectively store and retrieve memory contents, may involve multiple steps and accessing multiple memory cells at approximately the same time. One or more clock signals can serve to synchronize activities in a memory. Such clock signals can be distributed throughout the memory through its clock distribution network. Various components of a clock path, for example clock drivers and delay cells of a delay line, can be sensitive to variations in supply voltage and/or current used to power the memory. Clock path constituents can differ in their sensitivity to supply variations.

Memory devices are commonly powered by a variety of means. In some cases, the circuits are powered solely from an external source coupled to a power supply terminal. Memory device suppliers can specify minimum and maximum supply voltage and/or current (i.e., operating parameters) for proper operation of the memory device. Even within specified operating parameters, components of a clock path may exhibit different levels of sensitivity to supply variations sufficient to cause timing variations of the clock signal and outputs.

Circuits in a clock path that include delay circuits, for example, delay-lock loops, duty cycle correction circuits, clock generators, and other circuits, may introduce significant timing variation resulting from power supply sensitivity because each delay circuit may add a timing variation. Moreover, the delay circuits may have different responses to power supply variation, resulting in differing degrees of timing variations over a range of power supply variation. Whereas the timing variation introduced by each delay circuit may not be significant, the sum of the timing variations contributed by all of the delay circuits and the differences in power supply sensitivities may be enough to cause problems in operation.

BRIEF DESCRIPTION OF THE DRAWINGS

FIG. 5 is a schematic diagram of a delay compensation stage according to an embodiment of the invention.

FIG. 7 is a schematic diagram of a delay compensation stage according to an embodiment of the invention.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
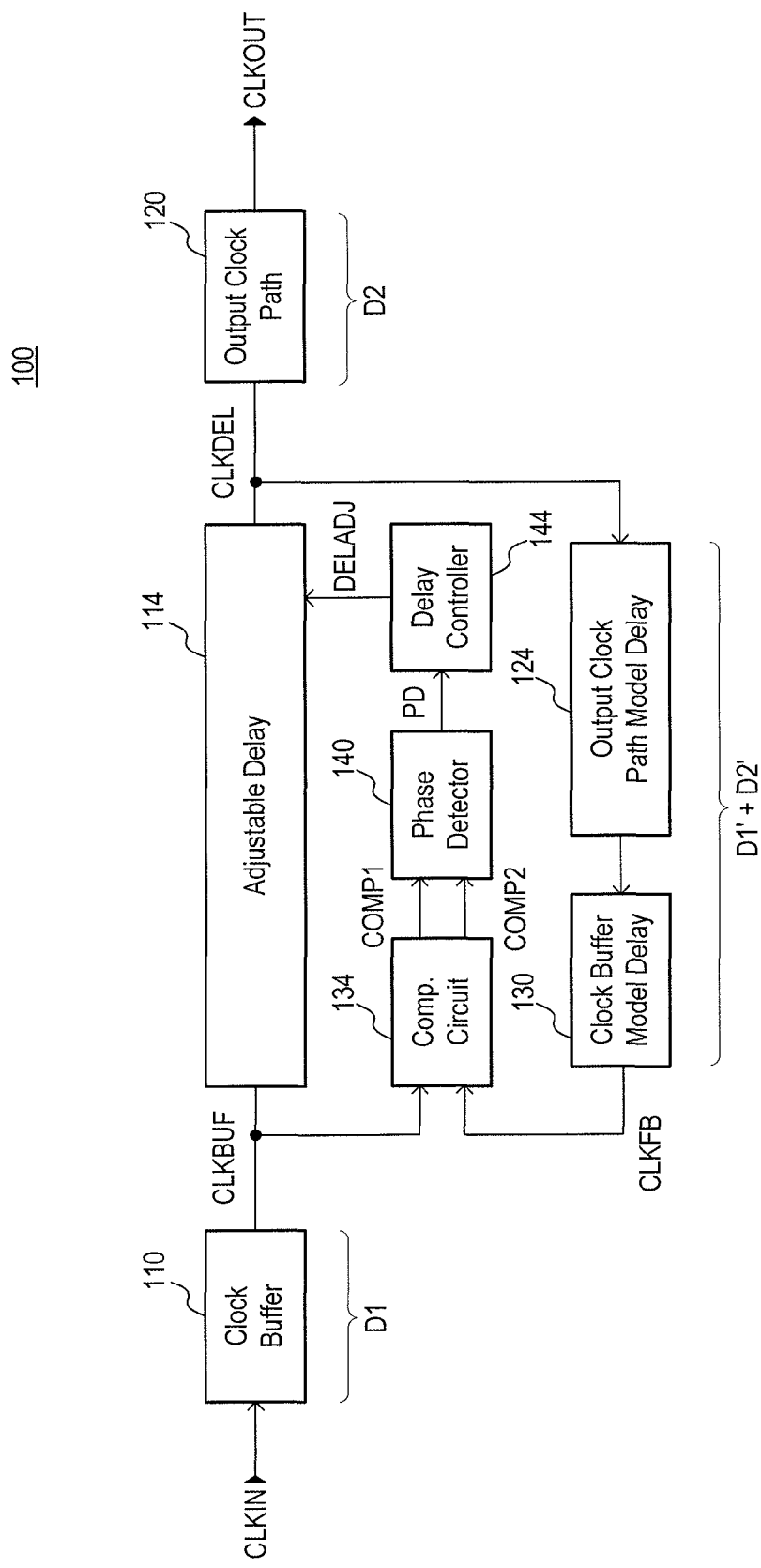
FIG. 1 is a block diagram of a circuit in a clock path according to an embodiment of the invention.

FIG. 1 illustrates an apparatus in the form of a circuit 100 in a clock path according to an embodiment of the invention. The circuit 100 is configured to provide an output clock signal CLKOUT that is in phase with an input clock signal CLKIN. Although in phase, the CLKOUT signal is delayed relative to the CLKIN signal. The circuit 100 includes a clock buffer 110 configured to be provided the CLKIN signal and provide a buffered clock signal CLKBUF to an adjustable delay 114. The CLKBUF signal has a delay D1 relative to the CLKIN signal due to the inherent propagation delay of the circuitry of the clock buffer 110. The adjustable delay 114 provides a delay to the CLKBUF signal to provide a delayed clock signal CLKDEL. The delay of the adjustable delay 114 is based at least in part on a delay adjustment signal DELADJ. The CLKDEL signal is output as the CLKOUT signal by a provided clock path 120. The CLKOUT signal has a delay D2 relative to the CLKDEL signal due to the inherent propagation delay of the output clock path 120. The output clock path 120 may include several circuits and signal lines. For example, in some embodiments of the invention the output clock path 120 includes a clock tree configured to distribute the CLKDEL signal from the adjustable delay 114 over signal lines to clock buffers that provide the CLKDEL signal to different circuits that may be clocked by the CLKOUT signal, such as clocked data buffers. The circuits and signal lines are represented in FIG. 1 as a functional block, however, in order to simplify FIG. 1. The circuits and signal lines have inherent propagation delay that adds to the CLKDEL signal. The propagation delay of the circuits and signal lines is represented in FIG. 1 by the D2 delay. The clock buffer 110, adjustable delay 114, and output clock path 120 may be considered a forward clock path having a forward clock path delay that includes the D1 and D2 delays, as well as the delay of the adjustable delay 114.

The CLKDEL signal is also provided to a feedback clock path having an output clock path model delay 124 and a clock buffer model delay 130. The output clock path model delay 124 models the propagation delay of output clock path 120, that is, the D2 delay, and the clock buffer model delay 130 models the propagation delay of the clock buffer 110, that is, the D1 delay. The total delay of the feedback model delay path is D1'+D2'. A feedback clock signal CLKFB having the D1'+D2' model delay relative to the CLKDEL signal is provided by the feedback clock path to a delay compensation circuit 134, which is also provided a reference clock signal (e.g., the CLKBUF signal from the clock buffer 110). The delay compensation circuit 134 is configured to compensate for differences in the delay power supply sensitivities of the static delays of the model delay D1'+D2' and the input-output (IO) delays of D1 of the clock buffer 110 and D2 of the output clock path 120. The delay power supply sensitivities of the different static delays cause delay variation based at least in part on power supply (e.g., voltage) variation.

Compensated clock signals COMP1, COMP2 are provided by the delay compensation circuit 134 to a phase detector 140. The phase detector 140 is configured to detect a phase difference between the COMP1 and COMP2 signals and provide a phase difference signal PD that is indicative of the phase difference between the COMP1 and COMP2 signals. In some embodiments, the PD signal has a voltage magnitude based at least in part on the phase difference of the COMP1 and COMP2 signals. The PD signal provided by the phase detector 140 is used by a delay controller 144 to provide the DELADJ signal to adjust the delay of the adjustable delay 114. As a result, the delay of the adjustable delay 114 is adjusted based at least in part on the phase difference of the COMP1 and COMP2 signals, which in effect is adjusting the delay of the adjustable delay 114 based at least in part on the phase difference of the CLKBUF and CLKFB signals.

In operation, the delay of the adjustable delay 114 is adjusted based on the PD signal provided by the phase detector 140 until the COMP1 and COMP2 signals are in phase. When the CLKBUF and CLKFB signals are in phase, the resulting CLKOUT signal will also be in phase with the CLKIN signal. The circuit 100 is said to be in a "locked" condition when the CLKBUF and CLKFB signals are in phase (i.e., the CLKOUT and CLKIN signal are in phase), and the delay of the adjustable delay 114 is not adjusted unless the CLKBUF and CLKFB signals drift out of phase, which may occur for various reasons.

For example, the delay variation of the clock buffer 110 and output clock path 120 to variations in power supply may be different than that of the model delays 124, 130. As a result, variations in the power supply may cause the D1 and D2 delay of the clock buffer 110 and output clock path 120, respectively, to change differently than the D1'+D2' model delay. Without any compensation provided by the delay compensation circuit 134, this may in turn cause the CLKOUT signal to drift as the forward clock path delay through the clock buffer 110, adjustable delay 114, and output clock path 120 responds to the power supply variation differently than the feedback clock path delay through the model delays 124 and 130. The adjustable delay 114 may adjust to resynchronize the CLKIN and CLKOUT signals, however, due to delay error resulting from differences in the delay power supply sensitivities of the static delays of the model delay D1'+D2' and the delays of D1 and D2 of the output clock path 120, the CLKIN and CLKOUT signals will remain out of phase. When the power supply varies again, for example, returning to a nominal condition, the change in the forward clock path delay will again be different than the feedback clock path delay, requiring further adjustment of the delay of the adjustable delay 114 to resynchronize the CLKIN and CLKOUT signals.

The delay compensation circuit 134, however, provides compensation for the different power supply sensitivities of the delays of the forward and feedback clock paths. In some embodiments, the delay compensation circuit 134 is configured to alter the timing of at least one of the CLKBUF and CLKFB signals. The timing may be altered according to a power supply sensitivity of the delay compensation circuit 134 that compensates for differences in the power supply sensitivities of the clock buffer 110 and output clock path 120, and the clock path model delay 124 and clock buffer model delay 130. As a result, the effect of variations in the power supply on forward and feedback clock paths will be compensated by the COMP1 and COMP2 signals provided to the phase detector 140.

Figure 2:
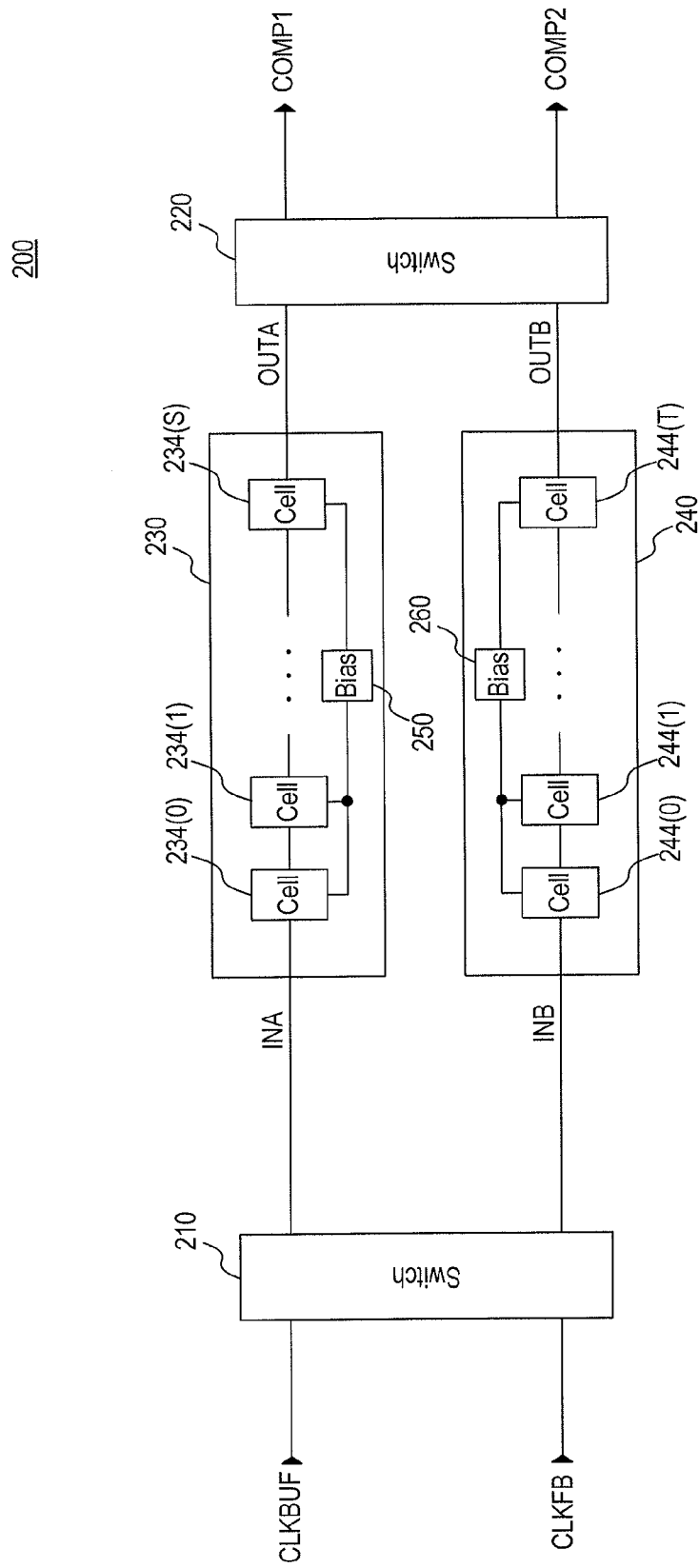
FIG. 2 is a block diagram of a delay compensation circuit according to an embodiment of the invention.

FIG. 2 illustrates a delay compensation circuit 200 according to an embodiment of the invention. The delay compensation circuit 200 may be used as the delay compensation circuit 134 of the circuit 100 of FIG. 1. The delay compensation circuit 200 includes switch circuits 210, 220 coupled to timing circuits 230, 240. The switch circuit 210 may be set to provide the CLKBUF signal to either timing circuit 230 or 240, and provide the CLKBUF signal to the other timing circuit. The output of the timing circuit 230 may be provided as either the COMP1 signal or COMP2 signal, and the output of the timing circuit 240 may be provided as the other signal, by the switch circuit 220. The switch circuits 210, 220 may be used to configure the delay compensation circuit 200 to provide desired compensation for the circuit in which the delay compensation circuit 200 is included. The response of a circuit in which the compensation circuit 200 is included may be different depending on the coupling of the CLKBUF and CLKFB signals to the timing circuits 230, 240. The switch circuits 210, 220 may be set during manufacture of an apparatus included the delay compensation circuit 200, for example, based on evaluation and testing of the apparatus.

The timing circuits 230 and 240 are configured to alter the timing of a respective input signal INA, INB (i.e., either CLKBUF or CLKFB) and provide a respective timing altered output signal OUTA, OUTB as either the COMP1 or COMP2 signal. The timing circuits 230 and 240 may be configured to each have predictable delay power supply sensitivities, which may be used to compensate for differences in delay power supply sensitivity between the static delays of the forward and feedback clock paths. That is, for example, one of the timing circuits 230, 240 may alter the timing of the respective input signal by delaying the input signal with a delay that decreases for an increasing power supply, and the other timing circuit 230, 240 may alter the timing of the respective input signal by delaying the input signal with a delay that increases for an increasing power supply. Timing circuits 230, 240 in other embodiments may have different delay power supply sensitivities to provide a different overall delay power supply sensitivity for the delay compensation circuit 200.

The timing circuit 230 includes at least one timing stage 234(0)-234(S). Each timing stage 234 is configured to alter the timing of its input signal in providing an output signal, and may alter the timing according to a delay power supply sensitivity that contributes to the overall delay power supply sensitivity of the timing circuit 230. Similarly, the timing circuit 240 includes at least one timing stage 244(0)-244(T), each of which is configured to alter the timing of its input signal in providing an output signal. Each timing stage 240 may have a delay power supply sensitivity that contributes to the overall power supply sensitivity of the timing circuit 230.

Bias circuits 250, 260 provide bias voltages to timing circuits 230, 240, respectively, to provide predictable delay power supply sensitivities of the timing circuits. The bias circuits 250, 260 may be the same, or may be different, for example, depending on the timing circuits 230, 240. The bias voltages may vary based at least in part on variations in power supply, and delays of the timing stages 234, 244 may be based at least in part on the bias voltages provided by the bias circuits 250, 260. As a result, the delays of the timing stages 234, 244, and consequently, the overall delay of the timing circuits 230, 240, may be based at least in part on power supply variation.

Switches (not shown) may be included in the timing circuits 230 and 240 to allow the respective timing circuit to use one or more of the timing stages 234, 244 to provide a desired overall delay power supply sensitivity. The switches may be used to bypass timing stages, and as a result, remove the bypassed timing stages from the clock path through the timing circuits 230 and 240. The delay variation provided by a timing circuit 230, 240 over a voltage range may consequently be tailored. For example, removing timing stages from the clock path through a timing circuit may decrease the power supply sensitivity for the timing circuit (i.e., decrease the degree of timing variation for an increasing voltage). That is, utilizing one timing stage may provide less delay variation over the voltage range in comparison to utilizing more than one timing stage for a timing circuit.

Figure 3A:
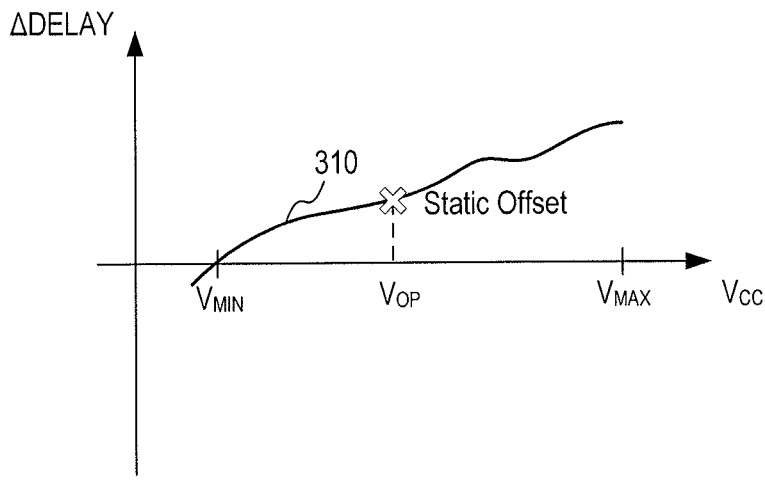
FIGS. 3A-3F are diagrams of delay variation over a voltage range related to operation of a delay compensation circuit according to an embodiment of the invention.

FIGS. 3A-3F illustrate diagrams that will be referenced in generally describing operation of a delay compensation circuit according to an embodiment of the invention. FIG. 3A illustrates line 310 representing a delay error between the static delays of the forward clock path and the feedback model delay of a circuit in a clock path (e.g., circuit 100) over a voltage range from a minimum voltage VMIN to a maximum voltage VMAX. Generally, the line 310 represents the difference in delay power supply sensitivities between the IO delay and the feedback model delay. An operating voltage VOP is also illustrated, representing a voltage which may be considered a nominal operating voltage condition. A static timing offset may be determined at the VOP voltage for the delay error of line 310. The static offset of the line 310 may represent a fixed delay error for the circuit in a clock path.

Figure 3B:
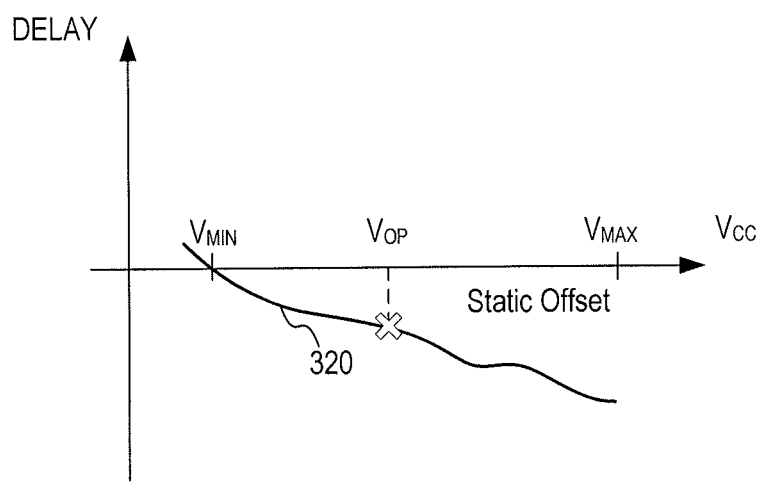
Figure 3C:
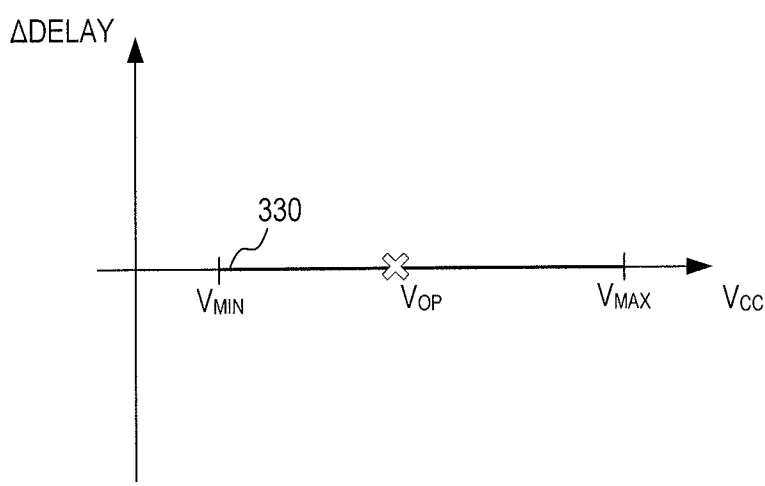

FIG. 3B illustrates a line 320 that represents an inverse delay variation for the delay error of line 310 of FIG. 3A. The inverse delay variation of line 320 summed with the delay error of line 310 results in zero timing variation over the range of VMIN to VMAX. Summing the inverse timing variation of line 320 with the delay error of line 310 results in line 330 of FIG. 3C. Thus, adding the inverse timing variation of line 330 to a circuits in a clock path that exhibits the delay error represented by line 310 may be used to compensate for the delay error over the VMIN to VMAX voltage range.

Figure 3D:
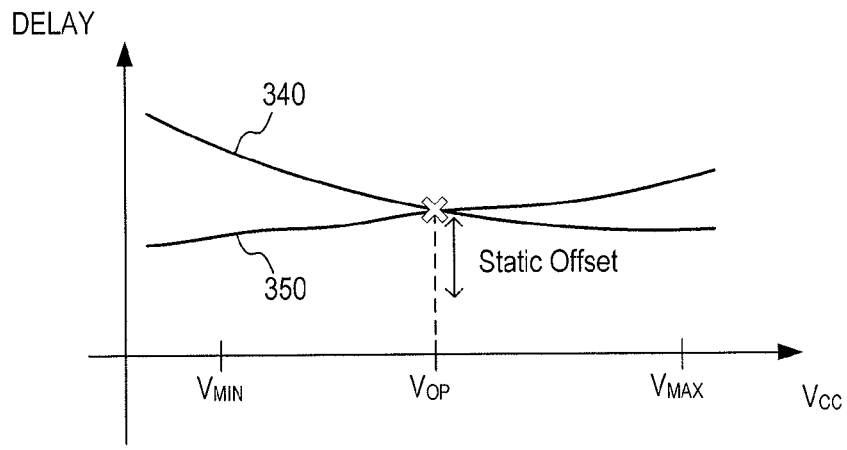

FIG. 3D illustrates lines 340, 350, each representing a delay variation of a respective timing circuit over a voltage range between the VMIN and VMAX voltages. For example, line 340 may represent a delay variation for timing circuit 230 of the delay compensation circuit 200 of FIG. 2 and line 350 may represent a delay variation for timing circuit 240. Line 340 represents a negative delay power supply sensitivity where the delay variation decreases for increasing power supply and the line 350 represents a positive delay power supply sensitivity where the delay variation increases for increasing power supply. As shown in FIG. 3D, the delay variations of lines 380, 390 intersect at the VOP voltage. That is, the delays are equal at the VOP voltage, and cancel each other out. The VOP voltage at which the delay variations intersect may be established by tailoring the circuitry of the timing circuits using conventional circuit designs and techniques, as will be described in more detail below.

Figure 3E:
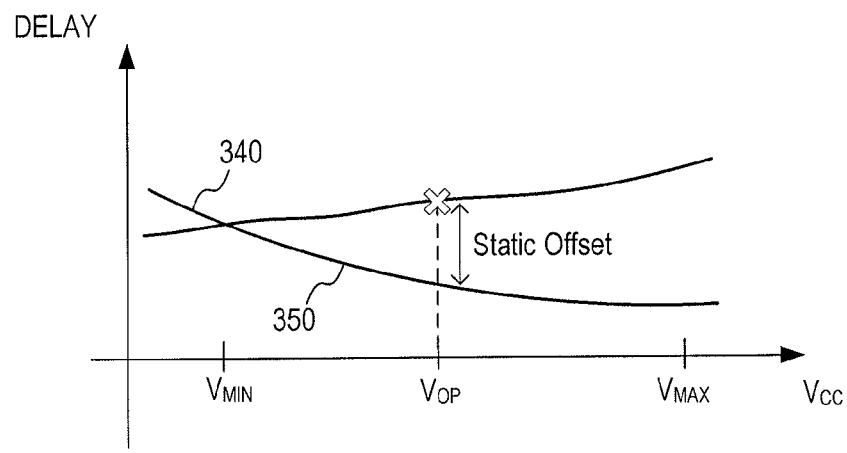
Figure 3F:
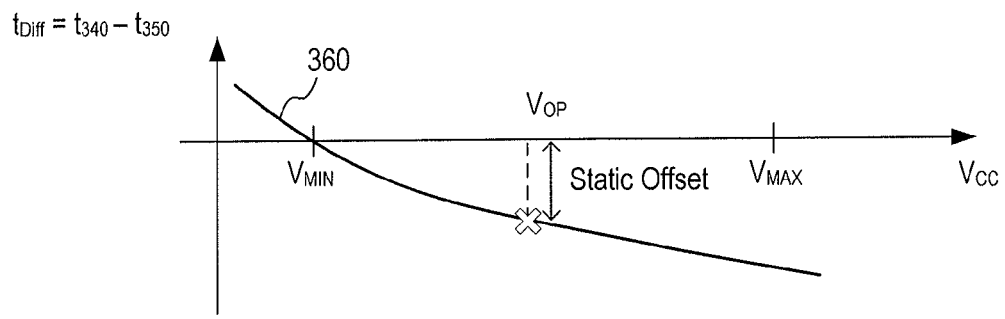

FIG. 3E illustrates lines 340, 350 with the delay variation of line 340 shifted by the static offset of FIG. 3A at the VOP voltage. The timing variation of line 340 is shifted by the static offset to provide a combined delay variation that models the inverse delay variation of FIG. 3B. FIG. 3F illustrates line 360 representing the effective combined delay variation provided by the delay variations of lines 340, 350 with the static offset at the VOP voltage. The combined delay variation results from a difference between the delay variations of lines 340, 350. The combined delay variation is similar to the inverse delay variation of line 320 (FIG. 3B). Thus, a delay compensation circuit providing a delay power supply sensitivity as represented by the combined delay variation of FIG. 3F may be used to compensate for delay error between static delays of the forward clock path (e.g., clock buffer and output clock path) and a feedback clock path of a circuit in a clock path (e.g., model delays).

In some embodiments, the compensation response of the delay compensation circuit 200 may be based at least in part on, for example, a clock frequency of an input signal. In this manner, the compensation provided by the delay compensation circuit 200 may have different compensation responses for a relatively low clock frequency and a relatively high clock frequency. For example, for a relatively low clock frequency the range of compensation (i.e., delay) over a range of power supply voltages may be smaller than the range of compensation over the range of power supply voltages for a relatively high clock frequency.

The compensation response of the delay compensation circuit 200 may be changed by changing the numbers of timing stages 234, 244 used for altering the timing of input signals. The compensation response may be changed by changing the response of bias circuits 250, 260. In selecting the compensation response of the delay compensation circuit, the clock frequency of the input signal may have correspondence to a number of delay elements of the adjustable delay (e.g., 114) used to synchronize the CLKIN and CLKOUT signals. Relatively high clock frequencies, for example, may need to use more delay elements to synchronize the CLKIN and CLKOUT signals in comparison to relatively low clock frequencies. The number of delay elements may be used as a measure of the clock frequency to switch between different compensation responses of the delay compensation circuit. The compensation response may be set, for example by programming an operating mode (e.g., programming a mode register) or set using circuitry such as programmable antifuses/fuses or metal options during manufacture.

Figure 4:
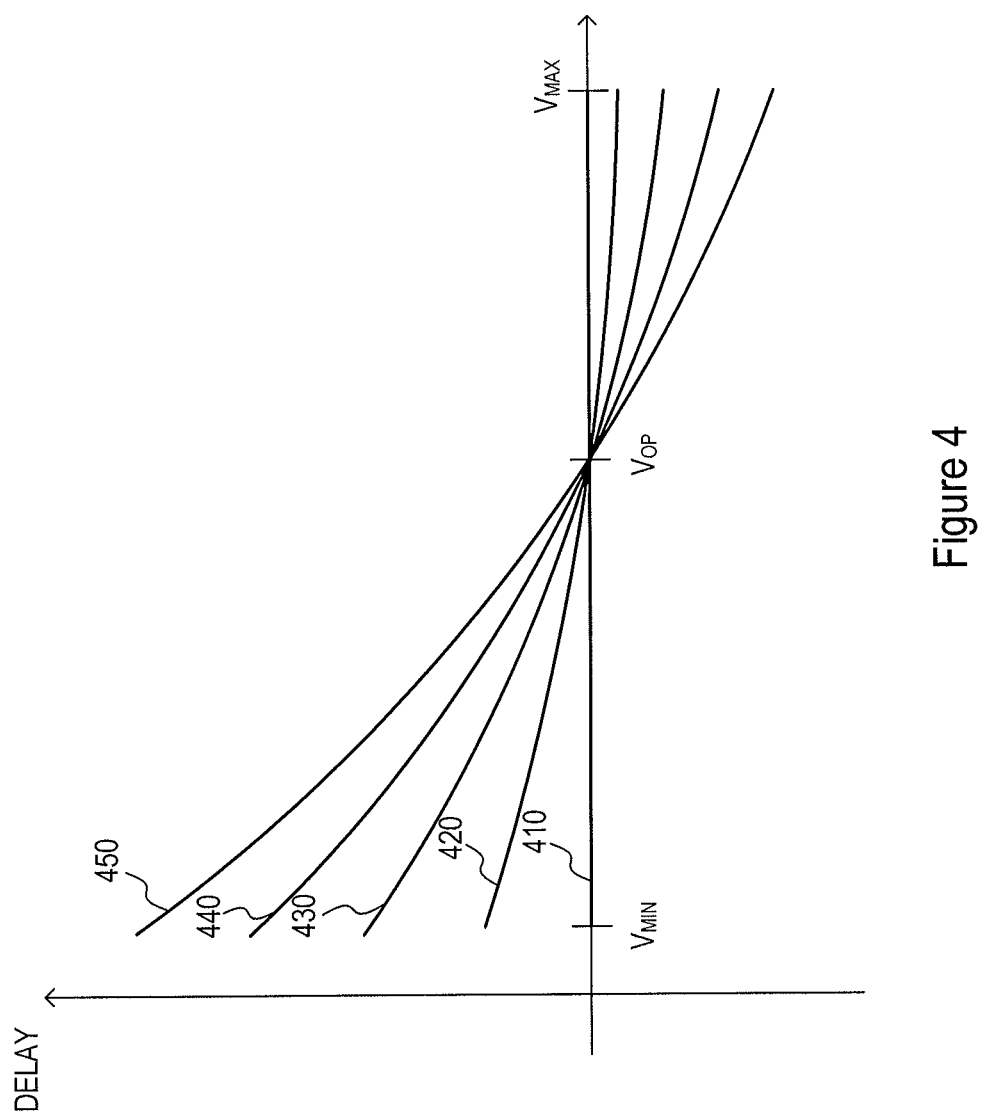
FIG. 4 is a diagram of delay variation over a voltage range for a timing circuit according to an embodiment of the invention.

As previously discussed, a timing circuit may use one or more of the timing stages to provide a desired overall power supply sensitivity. Using greater or fewer timing stages may, for example, change the range and response of delay variation over the VMIN to VMAX voltage range. FIG. 4 illustrates delay variation over a voltage range of VMIN to VMAX for different configurations of N timing stages of a timing circuit. Line 410 represents a delay variation where all of the timing stages are bypassed, and is consequently zero over the VMIN to VMAX voltage range. Line 450 represents a delay variation for a timing circuit where no timing stage is bypassed and N timing stages are used. Line 440 represents a delay variation where one timing stage is bypassed and N-1 timing stages are used. Likewise, lines 430 and 420 respectively represent the delay variation for the timing circuit where two and three timing stages are bypassed. The delay variations for the different timing stage configurations notably intersect at the VOP voltage, that is the nominal operation voltage.

With reference to the delay compensation circuit 200 of FIG. 2, in some embodiments, each timing stage 234 and 244 may alter the timing of input signals based on bias voltages generated respective bias circuits 250, 260 having predictable delay power supply sensitivities. As a result, as the power supply varies, the degree the timing stage 234 alters INA to provide OUTA and the degree the timing stage 244 alters NB to provide OUTB changes in a predictable manner.

FIG. 5 illustrates a timing stage 500 according to an embodiment of the invention. The timing stage 500 is configured to alter a timing of an input signal DIN to provide an output signal DOUT based at least in part on bias voltages BIASP and BIASN. For example, the timing stage 500 may delay the timing of the DIN signal to provide a delayed DOUT signal, with the degree of delay based at least in part on the BIASP and BIASN voltages. The timing stage 500 includes timing cells 510, 520 coupled in series. The timing cells 510, 520 are similar in that they include an inverter 512 and a bias controlled inverter 516. The bias controlled inverter 516 is configured to provide an output based at least in part on the BIASP and BIASN voltages provided to the timing cells 510, 520.

In some embodiments, the drive strength of the bias controlled inverter 516 is based at least in part on the BIASP and BIASN voltages. Providing BIASP and BIASN voltages to increase the drive strength of the bias controlled inverter 516 will result in longer delay provided by the timing cells 510, 520, and consequently, the resulting DOUT signal will be more delayed relative to the DIN signal. In this manner, the timing of the DIN signal may be altered based on the BIASP and BIASN voltages. Combined with a bias circuit having a positive power supply sensitivity that results in BIASP and BIASN voltages that increase drive strength with increasing power supply the timing stage 500 provides a DOUT signal having longer delay relative to the DIN signal for increasing power supply. Combined with a bias circuit having a negative power supply sensitivity that results in BIASP and BIASN voltages that decrease drive strength with increasing power supply the timing stage 500 provides a DOUT having shorter delay relative to the DIN signal for increasing power supply.

Figure 6:
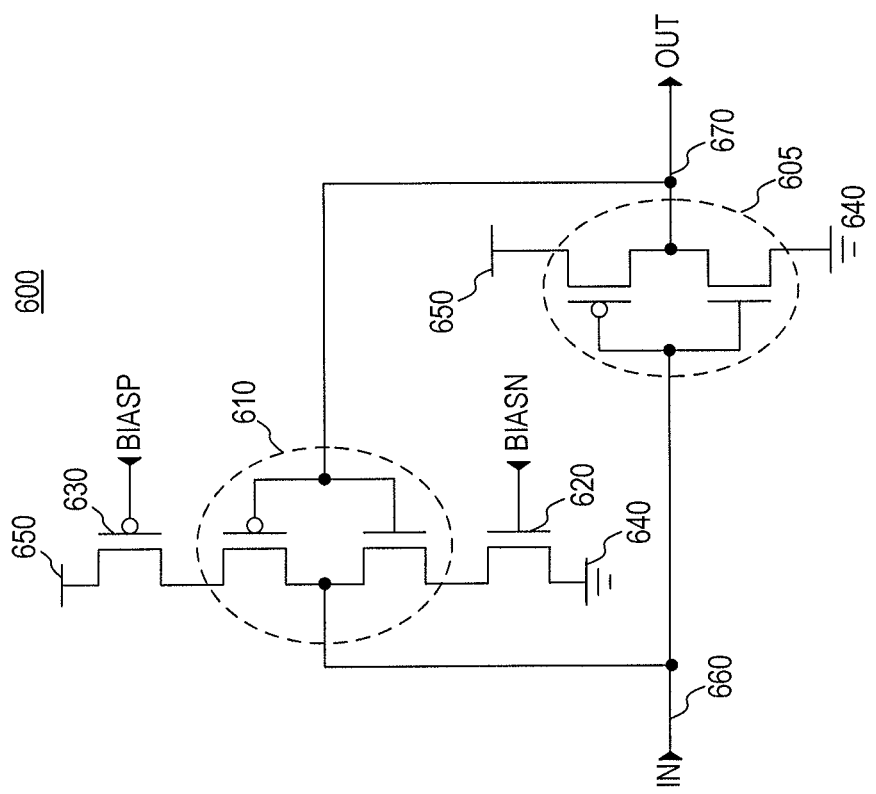
FIG. 6 is a schematic diagram of a timing cell according to an embodiment of the invention.

FIG. 6 illustrates a timing cell 600 according to an embodiment of the invention. The timing cell 600 may be used for the timing cells 510, 520 of the previously described embodiments, as well as other embodiments of the invention. The timing cell 600 includes an inverter 605 and an inverter 610. Responsive to a signal at the input 660 the inverter 605 is configured to provide an output signal at an output 670. A transistor 620 is coupled to the inverter 610 and a reference voltage 640, for example, ground and a transistor 630 is coupled to the inverter and a power supply 650. The transistor 620 receives a bias signal BIASN and the transistor 630 receives a bias signal BIASP. As previously discussed, the BIASN and BIASP signals may be based at least in part on the power provided by power supply 650 or a different power supply. The BIASN and BIASP signals may be used to control the output drive strength of the inverter 610. The output drive strength of the inverter 610 may be increased by increasing the voltage of the BIASN signal and decreasing the voltage of the BIASP signal, or combinations of both. The output drive may be decreased by decreasing a voltage of the BIASN and increasing a voltage of the BIASP signal, or combinations of the two. As the output drive strength of the inverter is increased the delay of the timing cell 600 relatively increases and as the output drive strength is decreased the delay relatively decreases.

FIG. 7 illustrates a timing stage 700 according to an embodiment of the invention. The timing stage 700 is configured to alter a timing of an input signal DIN to provide an output signal DOUT based at least in part on bias voltages BIASP and BIASN. For example, the timing stage 700 may delay the timing of the DIN signal to provide a delayed DOUT signal, with the degree of delay based at least in part on the BIASP and BIASN voltages. The timing stage 700 includes timing cells 710, 720 coupled in series. The timing cells 710, 720 include an inverter 712 and a bias controlled inverter 716 configured to provide an output based at least in part on the BIASP and BIASN voltages.

In some embodiments, the drive strength of the bias controlled inverter 716 is based at least in part on the BIASP and BIASN voltages. Providing BIASP and BIASN voltages to increase the drive strength of the bias controlled inverter 716 will result in a shorter delay provided by the timing cells 710, 720, and consequently, the resulting DOUT signal will have a shorter delay relative to the DIN signal. In this manner, the timing of the DIN signal may be altered based on the BIASP and BIASN voltages. Combined with a bias circuit having a positive power supply sensitivity that provides BIASP and BIASN voltages to increase drive strength for increasing power supply, the timing stage 700 provides a DOUT signal having shorter delay relative to the DIN signal for increasing power supply. Combined with a bias circuit having a negative power supply sensitivity the timing stage 700 provides a DOUT having longer delay relative to the DIN signal for increasing power supply.

Figure 8B:
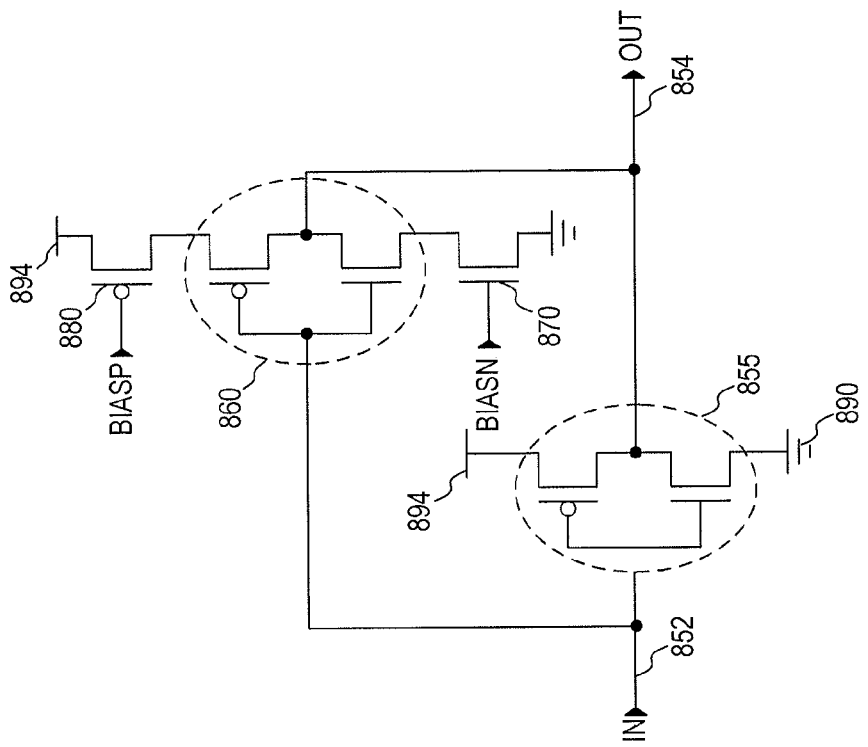
FIG. 8B is a schematic diagram of a timing cell according to an embodiment of the invention.
Figure 8A:
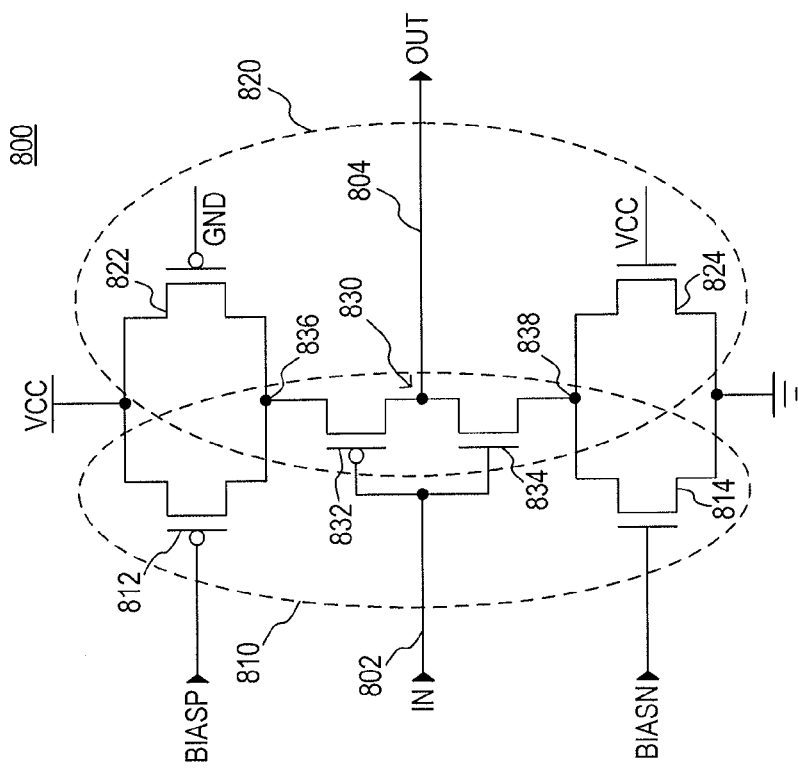
FIG. 8A is a schematic diagram of a timing cell according to an embodiment of the invention.

FIG. 8A illustrates a bias controlled clock timing cell 800 according to an embodiment of the invention. The clock timing cell 800 may be used for the timing cells 710, 720 of FIG. 7. The clock timing cell 800 includes a bias controlled inverter 810 and an inverter 820. In the embodiment illustrated in FIG. 8A an inverter circuit 830 including transistors 832 and 834 is shared by the bias controlled inverter 810 and the inverter 820. The transistors 832 and 834 may be a pFET and nFET coupled to an input node 802 and an output node 804. In addition to the inverter circuit 830, the bias controlled inverter 810 includes transistor 812 coupled between the inverter circuit 830 at node 836 and a voltage supply node and further includes transistor 814 coupled between the inverter circuit 830 at node 838 and a reference supply node providing a reference voltage. The voltage supply node provides a supply voltage, such as VCC, and the reference supply node provides a reference voltage, for example, ground. The transistor 812 is provided a first bias signal BIASP and the transistor 814 is provided a second bias signal BIASN. The transistor 812 may be a pFET and the transistor 814 may be an nFET, as illustrated for the embodiment shown in FIG. 8A.

The inverter 820 includes in addition to the inverter circuit 830 transistors 822 and 824. The transistor 822 is coupled between the inverter circuit 830 and the voltage supply node and the transistor 824 is coupled between the inverter circuit 830 and the reference voltage node. The transistor 822 may be a pFET and the transistor 824 may be an nFET, as illustrated in the embodiment shown in FIG. 8A. In such an embodiment, the transistor 822 may be biased by the reference voltage and the transistor 824 may be biased by the supply voltage during operation.

In operation, the clock timing cell 800 provides an output signal OUT at the output node 804 responsive to an input signal IN provided at the input node 802. The OUT signal may be driven in part by the inverter 820 and in part by the bias controlled inverter 810. With the transistors 822 and 824 biased by the reference voltage and the supply voltage respectively, the supply voltage is provided to node 836 and the reference voltage is provided to node 838, all respectively.

The transistors 822 and 824 are configured to have relatively weak drive strengths compared to the bias controlled inverter 810, and may be included to prevent edges of the OUT signal from collapsing at extreme ends of a range over which a drive strength of the bias controlled inverter 810 may be adjusted. The drive strength of the bias controlled bias controlled inverter 810, which adds to the drive strength of the inverter 820, is adjusted by voltages of the BIASP and BIASN signals. For example, with reference to the transistor 822, the transistor 812 may be made more conductive by the BIASP signal to increase the drive strength and thereby cause a rising edge of the OUT signal to transition faster from ground to VCC responsive to a IN signal having a low voltage level. Alternatively, the transistor 812 may be made less conductive by the BIASP signal to decrease the drive strength and thereby cause the rising edge of the OUT signal to transition from ground to VCC relatively more slowly. Similarly, the transistor 814 may be made more conductive by the BIASN signal to increase the drive strength and thereby provide a faster transition for a falling edge of the OUT signal or made less conductive to decrease the drive strength and provide a relatively slower transition for the falling edge of the OUT signal.

FIG. 8B illustrates a clock timing cell 850 according to an embodiment of the invention. The timing cell 850 may be used for the timing cells 710, 720 of the previously described embodiments, as well as other embodiments of the invention. The timing cell 850 includes an inverter 855 and an inverter 860. Responsive to a signal at the input 852 the inverter 855 is configured to provide an output signal at an output 854. A transistor 870 is coupled to the inverter 860 and a reference voltage 890, for example, ground and a transistor 880 is coupled to the inverter and a power supply 894. The transistor 870 receives a bias signal BIASN and the transistor 880 receives a bias signal BIASP. As previously discussed, the BIASN and BIASP signals may be based at least in part on the power provided by power supply 894 or a different power supply. The BIASN and BIASP signals may be used to control the output drive strength of the inverter 860. The output drive strength of the inverter 860 may be increased by increasing the voltage of the BIASN signal and decreasing the voltage of the BIASP signal, or combinations of both. The output drive may be decreased by decreasing a voltage of the BIASN and increasing a voltage of the BIASP signal, or combinations of the two. As the output drive strength of the inverter 860 is increased the delay of the timing cell 800 relatively decreases and as the output drive strength is decreased the delay relatively increases.

As previously discussed, providing BIASP and BIASN voltages from a bias circuit having a known power supply sensitivity may be used with timing stages, for example, timing stages 500 and 700, of a timing circuit included in a delay compensation circuit, such as delay compensation circuit 134, to compensate for delay power supply sensitivity difference of static delays of a forward clock path and a feedback clock path of a circuit in a clock path.

Figure 9:
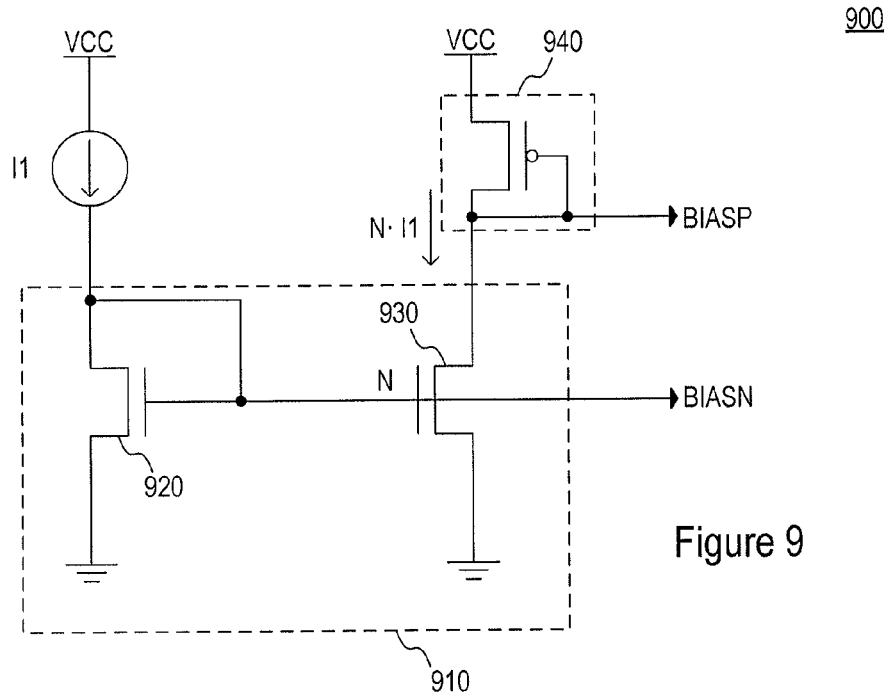
FIG. 9 is a schematic diagram of a bias circuit according to an embodiment of the invention.

FIG. 9 illustrates a bias circuit 900 according to an embodiment of the invention. The bias circuit 900 is configured to provide decreasing BIASP and increasing BIASN voltages based at least in part on an increasing power supply. That is, the bias circuit 900 has a positive power supply sensitivity. The bias circuit 900 includes a current mirror 910 having transistors 920, 930 coupled in a current mirror configuration. The transistors 920, 930 are illustrated in FIG. 9 as n-channel field effect (nFET) transistors, however, other types of transistors may be used as well. Based at least in part on an input current I1, the current mirror 910 provides an output current N*I1 which is the I1 current scaled by a factor of N. The factor N is based at least in part on the transistor characteristics of the transistor 930 relative to the transistor characteristics of the transistor 920. For example, the transistor 930 may conduct N times the current of the transistor 920 for a given gate voltage, resulting in an output current that is N times the I1 current. A bias voltage BIASN is provided by the gate voltage for the transistors 920, 930 resulting from the I1 current. A load circuit 940 is coupled to the transistor 930 to provide bias voltage BIASP. The load circuit 940 is illustrated in FIG. 9 as a diode coupled p-channel field effect (pFET) transistor, however, other load circuits may be used as well.

In operation, the I1 current may be based at least in part on a power supply, for example, VCC as illustrated in FIG. 9. Typically, as the power supply increases the resulting I1 increases, and as the power supply decreases, the resulting I1 decreases. In the case of an increasing I1 current, the BIASN voltage increases as the gate voltages for the transistors 920, 930 increases. The output current provided by the transistor 930 also increases, which in turn decreases the BIASP voltage provided by the load circuit 940. As a result, the BIASN voltage increases and the BIASP voltage decreases with an increasing power supply. Likewise, the BIASN voltage decreases and the BIASP voltage increases with a decreasing power supply (i.e., decreasing I1 current).

Using the bias circuit 900 with the timing stage 500, for example, may provide a timing circuit that alters the timing of signals by adding delay to signals based at least in part on an increasing power supply, and as the power supply decreases, the length of delay will decrease. With reference to the timing stage 500, decreasing the BIASP voltage and increasing the BIASN voltage may result in more delayed DOUT signal relative to the DIN signal. As also previously discussed, the bias circuit 900 provides decreasing BIASP and increasing BIASN signals based at least in part on an increasing power supply. By combining with the power supply response of the bias circuit 900 and the timing stage 500 response to the BIASP and BIASN signals, an output clock signal may be further delayed relative to an input clock signal for increasing power supply.

Figure 10:
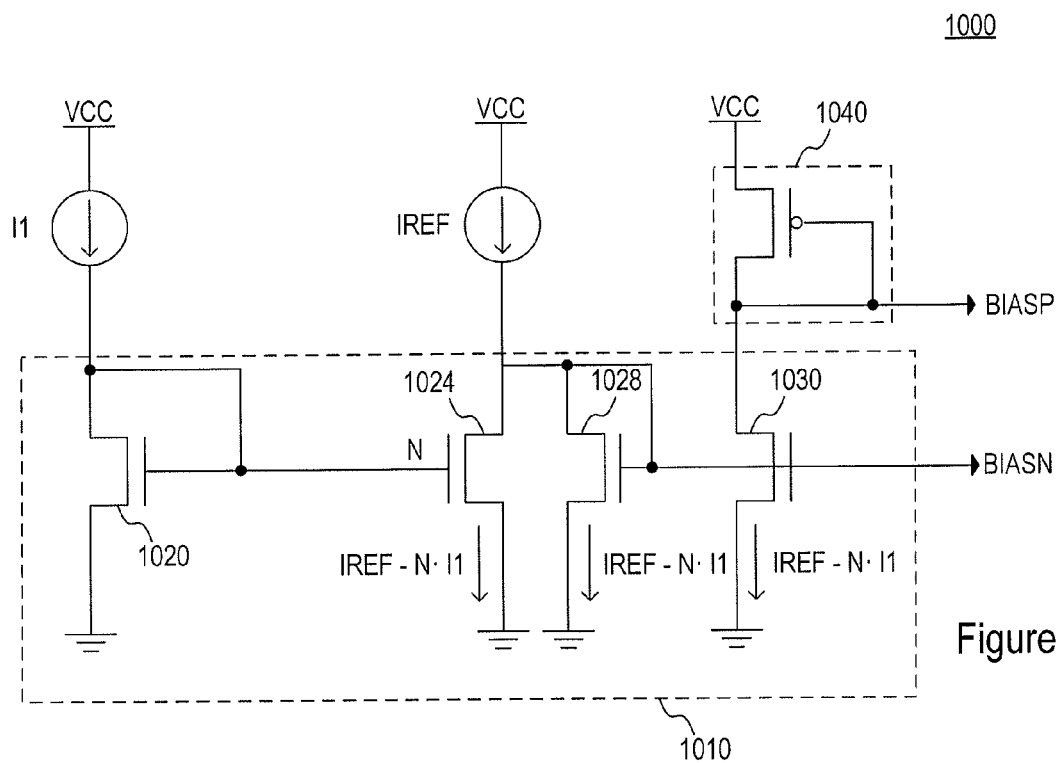
FIG. 10 is a schematic diagram of a bias circuit according to an embodiment of the invention.

FIG. 10 illustrates a bias circuit 1000 according to an embodiment of the invention. The bias circuit 1000 is configured to provide increasing BIASP voltage and decreasing BIASN voltage based at least in part on increasing power supply. That is, the bias circuit 1000 has a negative power supply sensitivity. The bias circuit 1000 includes a current circuit 1010 having transistors 1020, 1024, 1028, 1030. A reference current IREF current is provided to the transistor 1024. The transistors 1020, 1024, 1028, and 1030 are coupled in a configuration to provide an output current having a difference between a reference current TREF and an input current I1. The transistors 1020, 1024, 1028, 1030 are illustrated in FIG. 10 as nFET transistors, however, other types of transistors may be used as well.

Based at least in part on the I1 current, the current circuit 1010 provides an output current IREF−N*I1, where the I1 current may be scaled by a factor of N. The factor N is based at least in part on the transistor characteristics of transistor 1024 relative to the transistor characteristics of the transistor 1020. A current difference IREF−N*I1 is established by the transistor 1024 at node 1026 due to the I1 current mirrored in the transistor 1024 and the IREF current provided to transistor 1024. The IREF−N*I1 current is provided to transistor 1028 as an input current, which is mirrored by transistor 1030. A bias voltage BIASN is provided by the gate voltage for the transistors 1028, 1030 resulting from the current of IREF−N*I1. A load circuit 1040 is coupled to the transistor 1030 to provide bias voltage BIASP resulting from the IREF−N*I1 current provided by transistor 1030. The load circuit 1040 is illustrated in FIG. 10 as a diode coupled pFET transistor, however, other load circuits may be used as well.

In operation, the I1 current may be based at least in part on a power supply, for example, VCC as illustrated in FIG. 10. Typically, as the power supply increases the resulting I1 current increases, and as the power supply decreases the resulting I1 current decreases. In the case of an decreasing I1, the difference of IREF−N*I1 increases which causes the BIASN voltage to increase as the gate voltages for the transistors 1028, 1030 increases. The output current (i.e., IREF−N*I1) provided by the transistor 1030 also increases, which in turn decreases the BIASP voltage provided by the load circuit 1040. As a result, both the BIASN voltage increases and the BIASP voltage decreases with a decreasing power supply. Likewise, both the BIASN voltage decreases and the BIASP voltage increases with a increasing power supply (i.e., increasing I1 current and decreasing IREF−N*I1 difference).

Using the bias circuit 1000 with the timing stage 700, for example, may provide a timing circuit that alters the timing of signals by effectively decreasing delay based at least in part on an decreasing power supply, and as the power supply increases the delay will increase. With reference to the timing stage 700, decreasing the BIASP voltage and increasing the BIASN voltage may result in a DOUT signal having less delay relative to the DIN signal. As also previously discussed, the bias circuit 1000 provides decreasing BIASP voltage and increasing BIASN voltage based at least in part on a decreasing power supply. By combining the power supply response of the bias circuit 1000 and the timing stage 700 response to the BIASP and BIASN signals, an output clock signal may have decreasing delay relative to an input clock signal for decreasing power supply.

As previously discussed, an operating voltage VOP that is considered a nominal voltage may be established through the use of circuitry of a timing circuit. It may be desirable to set the VOP voltage for different applications of delay error compensation, for example, for circuits or systems that operate under different power supply voltages. The VOP voltage may be set by providing timing circuits that have their respective delay equal at the VOP voltage. That is, at the VOP voltage the timing circuits provide the same amount of delay at the VOP voltage. This condition is graphically shown by having lines representing the respective power supply sensitivities intersection at the VOP voltage, as illustrated in FIG. 3D. Circuits of the timing circuits may be designed to provide the desired response at the VOP voltage, for example, the timing cells and bias circuits may be set to operate according to the VOP voltage through the use of current scaling, transistor operating characteristics, bias operating conditions, and other design parameters for the circuits.

The timing stages 500, 700 and bias circuits 900, 1000 may be used in a timing circuit, for example, timing circuits 230 and 240 of FIG. 2, to provide a delay power supply response for a delay compensation circuit that may be used to compensate for differences in power supply sensitivities of static delays of the forward clock path (e.g., input buffer and output clock path) and the feedback clock path (e.g., model delay), as previously described. In this manner, negative timing effects due to differing power supply sensitivities (e.g., clock signal and data eye timing variation) may be compensated. In some embodiments, the power supply for the timing stages may be different than the power supply for bias circuits (e.g., different power supply rails), and respond accordingly to variations in the respective power supplies. In other embodiments, the power supply for the timing stages and the bias circuits are the same, and are subject to the same power supply variations.

Figure 11:
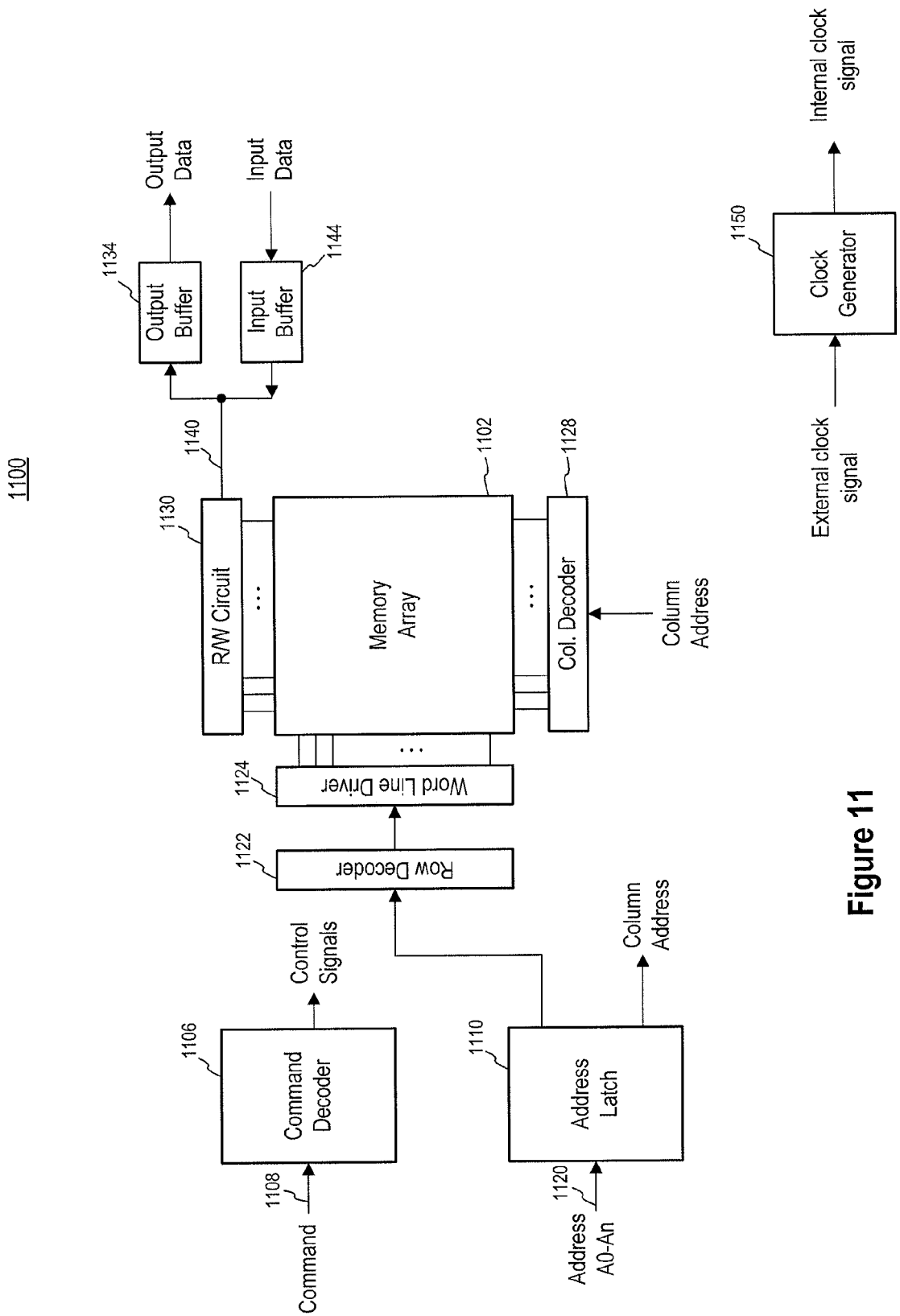
FIG. 11 is a block diagram of a memory according to an embodiment of the invention.

FIG. 11 illustrates a memory 1100 according to an embodiment of the invention. The memory 1100 includes an array 1102 of memory cells, which may be, for example, DRAM memory cells, SRAM memory cells, flash memory cells, or some other type of memory cells. The memory system 1100 includes a command decoder 1106 that receives memory commands through a command bus 1108 and generates corresponding control signals within the memory system 1100 to carry out various memory operations. The command decoder 1106 responds to memory commands applied to the command bus 1108 to perform various operations on the memory array 1102. For example, the command decoder 1106 is used to generate internal control signals to read data from and write data to the memory array 1102. Row and column address signals are applied to the memory system 1100 through an address bus 1120 and provided to an address latch 1110. The address latch then outputs a separate column address and a separate row address.

The row and column addresses are provided by the address latch 1110 to a row address decoder 1122 and a column address decoder 1128, respectively. The column address decoder 1128 selects bit lines extending through the array 1102 corresponding to respective column addresses. The row address decoder 1122 is connected to word line driver 1124 that activates respective rows of memory cells in the array 1102 corresponding to received row addresses. The selected data line (e.g., a bit line or bit lines) corresponding to a received column address are coupled to a read/write circuitry 1130 to provide read data to a data output buffer 1134 via an input-output data bus 1140. Write data are applied to the memory array 1102 through a data input buffer 1144 and the memory array read/write circuitry 1130.

A circuit 1150 in a clock path according to an embodiment of the invention is configured to receive an external clock signal and generate a synchronized internal clock signal. The circuit 1150 may supply one or more clock signals to one or more of the command decoder 1106, address latch 1110, read/write circuitry 1130, data output buffer 1134, and input buffer 1144 to facilitate the latching of command, address, and data signals in accordance with the external clock.

Memories in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
a first timing circuit configured to alter timing of the first clock signal to provide a first altered clock signal, wherein the first timing circuit is configured to alter the first clock signal according to a first power supply sensitivity, the first timing circuit including a timing stage configured to delay an input signal and provide an output clock signal having the a delay relative to the input signal, the delay varying with varying power supply; and
a second timing circuit configured to alter timing of a second clock signal to provide a second altered clock signal, wherein the second timing circuit is configured to alter the second clock signal according to a second power supply sensitivity.

2. The apparatus of claim 1 wherein the first power supply sensitivity and the second power supply sensitivity are opposite of one another.

3. The apparatus of claim 1 wherein the first power supply sensitivity is a negative power supply sensitivity and the second power supply sensitivity is a positive power supply sensitivity.

4. The apparatus of claim 3 wherein the first power supply sensitivity is equal to the second power supply sensitivity at a nominal voltage.

5. The apparatus of claim 1 wherein the first power supply sensitivity is greater than the second power supply sensitivity.

6. The apparatus of claim 1 wherein first timing circuit further comprises a bias circuit configured to provide a bias voltage to the timing stage, the bias voltage varying with varying power supply, and wherein the timing stage comprises:
   an inverter; and
   a bias controlled inverter coupled to the inverter.

7. The apparatus of claim 6 wherein the timing stage is configured to provide more delay for increasing bias voltage.

8. The apparatus of claim 6 wherein the timing stage is configured to provide less delay for increasing bias voltage.

9. The apparatus of claim 6 wherein outputs of the inverter and the bias controlled inverter are coupled.

10. The apparatus of claim 6 wherein an output of the bias controlled inverter is coupled to an input of the inverter.

11. The apparatus of claim 6 wherein the bias circuit comprises a current mirror and a load circuit, the bias circuit configured to provide an increasing bias voltage for increasing power supply.

12. The apparatus of claim 6 wherein the bias circuit comprises a current circuit and a load circuit, the current circuit configured to provide decreasing current for increasing power supply.

13. The apparatus of claim 1 wherein the second timing circuit comprises:
   a second timing stage configured to delay the input signal and provide a second output clock signal having a second delay relative to the input signal, the second delay varying with varying power supply.

14. The apparatus of claim 13 wherein the timing stages of the first and second timing circuits are the same, and wherein the first timing circuit further comprises first and second bias circuits, the first bias circuit configured to provide a first bias voltage to the first timing stage, the first bias voltage varying with varying power supply, the second bias circuit configured to provide a second bias voltage to the second timing stage, the second bias voltage varying with varying power supply, the varying of the second bias voltage opposite of the varying of the first bias voltage.

15. An apparatus, comprising:
   a forward clock path having input-output delay and adjustable delay;
   a feedback clock path having model delay;
   a delay compensation circuit coupled to the forward and feedback clock paths, the delay compensation circuit configured to compensate for a difference in power supply sensitivities of the input-output delay and the model delay;
   a phase detector coupled to the delay compensation circuit and configured to detect a phase difference between first and second clock signals from the delay compensation circuit and provide a phase difference signal indicative of the phase difference; and
   a delay controller coupled to the phase detector and configured to adjust the adjustable delay based at least in part on the phase difference signal.

16. The apparatus of claim 15 wherein the forward clock path comprises an input clock buffer and an output clock path, and wherein the model delay is configured to model propagation delays of the input clock buffer and the output clock path.

17. The apparatus of claim 15 wherein the delay compensation circuit is configured to provide a timing variation over a range of power supply variation that is inverse to the timing variation of the difference in power supply sensitivities.

18. The apparatus of claim 17 wherein the timing variation over the range of power supply variation is provided by a plurality of timing circuits, each timing circuit having a respective timing variation over the range of power supply variation that contributes to the timing variation of the delay compensation circuit.

19. The apparatus of claim 15 wherein the delay compensation circuit is set to couple the forward and feedback clock paths through the delay compensation circuit to provide the first and second clock signals.

20. The apparatus of claim 15, further comprising:
   an array of memory;
   input and output data paths coupled to the array of memory; and
   input and output circuitry coupled to the input and output data paths, the input and output circuitry configured to provide data to and data from the array of memory.

21. The apparatus of claim 15 wherein the delay compensation circuit has a plurality of different compensation responses to compensate for a difference in power supply sensitivities of the input-output delay and the model delay.

22. The apparatus of claim 21 wherein the compensation response of the plurality used to compensate for a difference in power supply sensitivities is based at least in part on a clock frequency of a clock signal provided to the forward clock path.

23. The apparatus of claim 21 wherein the compensation response of the plurality used to compensate for a difference in power supply sensitivities is set.

* * * * *

UNITED STATES PATENT AND TRADEMARK OFFICE
CERTIFICATE OF CORRECTION

PATENT NO.        : 8,717,835 B2
APPLICATION NO.   : 13/215705
DATED             : May 6, 2014
INVENTOR(S)       : Yantao Ma et al.

Page 1 of 1

It is certified that error appears in the above-identified patent and that said Letters Patent is hereby corrected as shown below:

In the Claims

In column 12, line 54, in Claim 1, delete "the a delay" and insert -- a delay --, therefor.

Signed and Sealed this
Nineteenth Day of August, 2014

Michelle K. Lee
*Deputy Director of the United States Patent and Trademark Office*